United States Patent [19]
Yamamoto

[11] Patent Number: 5,684,430
[45] Date of Patent: Nov. 4, 1997

[54] POWER AMPLIFIER ADAPTED TO SIMPLIFY ADJUSTMENT WORK FOR PREVENTING OCCURRENCE OF PARASITIC OSCILLATION

[75] Inventor: Takashi Yamamoto, Nakakoma-gun, Japan

[73] Assignee: Fujitsu Limited, Kawasaki, Japan

[21] Appl. No.: 372,372

[22] Filed: Jan. 13, 1995

[30] Foreign Application Priority Data

Mar. 17, 1994 [JP] Japan ..................... 6-047404

[51] Int. Cl.⁶ .................................. H03F 3/68
[52] U.S. Cl. ...................... 330/124 R; 330/107
[58] Field of Search .............................. 330/53, 65, 107, 330/124 R, 286, 295, 302

[56] References Cited

U.S. PATENT DOCUMENTS 5,066,924  11/1991  Wendt ................... 330/124 R

FOREIGN PATENT DOCUMENTS 3341570  5/1985  Germany ..................... 330/124 R

*Primary Examiner*—Steven Mottola
*Attorney, Agent, or Firm*—Staas & Halsey

[57] ABSTRACT

A power amplifier includes a power distributor for dividing an input signal into a plurality of equally power-distributed signals; a plurality of amplifying elements for amplifying the plurality of equally power-distributed signals divided by the power distributor, respectively; a power coupler for coupling respective output signals of the plurality of amplifying elements; and a variable resistance element provided between nodes having the same phase as each other on power transmission lines in at least one side of each input side and each output side of the plurality of amplifying elements. By the constitution, it is possible to prevent occurrence of a parasitic oscillation and thus contribute to an improvement in yield as a product.

23 Claims, 5 Drawing Sheets

POWER AMPLIFIER ADAPTED TO SIMPLIFY ADJUSTMENT WORK FOR PREVENTING OCCURRENCE OF PARASITIC OSCILLATION

BACKGROUND OF THE INVENTION

1. Field of the Invention

The present invention relates to a power amplifier, and more particularly, to a transmission power amplifier used in a relatively high frequency band such as a microwave frequency band.

2. Description of the Related Art

It is generally known that transmission power amplifiers which can obtain a high gain in a relatively high frequency band such as a microwave frequency band, especially in an "L" band or "C" band, frequently cause a parasitic oscillation. Such a parasitic oscillation occurs due to dispersion of characteristics of components (FET chips working as amplifying elements, input/output matching circuits mounted on a matching circuit substrate, power distributor, power coupler, and the like) used in the manufacturing process of power amplifiers, or due to dispersion of assembly work thereof.

Whether a parasitic oscillation occurs or not cannot be checked until the completion of assembly work of components of a power amplifier. Accordingly, if the above parasitic oscillation can be canceled by a suitable adjustment, made after the power amplifier is completed as a device, it would be possible to greatly improve the rate of acquisition of good products, i.e., yield. In view of this, power amplifiers which are provided with means for easily carrying out such an adjustment work have been in great demand.

Parasitic oscillations concerned with the state of the art to which the present invention pertains are classified into two kinds of oscillation, i.e., a loop oscillation and an oscillation due to an unstable domain. A loop oscillation is one which occurs when odd-number mode waves appear on power transmission lines in a balanced-type power amplifier. Namely, the odd-number mode waves circulate in a closed circuit (i.e., a loop) formed between a power distributor and a power coupler, and thus cause a loop oscillation. On the other hand, an oscillation due to an unstable domain is one which occurs when prescribed conditions for oscillation are met depending on characteristics (coefficient of stability, or coefficient of oscillation, a so-called "K" value) of FETs and on the settings of impedances of input/output matching circuits.

Conventionally, to prevent the above parasitic oscillations, there is known a power amplifier of the type in which a resistor is connected between nodes having a common phase and disposed on power transmission lines at the output side of a power distributor and at the input side of a power coupler, respectively. Such a resistor thus connected is referred to as a "balance resistor", and is known to a person skilled in the art. Such a balance resistor is definitely discriminated from an isolation resistor which is generally used in a power amplifier (This resistor is provided at a node disposed at ¼ wavelength from an output end of a power distributor, or from an input end of a power coupler on corresponding power transmission lines).

Where an optimum resistance value is set in such a balance resistor, it is possible to suppress an oscillation due to a loop oscillation.

In the prior art, however, it has been very difficult to set the optimum resistance value for suppression of the loop oscillation, due to dispersion of characteristics of components in use, or due to dispersion of assembly work of the components. In view of this, it has been preferable that a power amplifier has a structure which enables its resistance value to be variably setting after completion of the assembly work.

As one approach to variably set the resistance value, it could be thought to mount a micro variable resistor on a circuit substrate. This approach, however, poses a problem in that it is very difficult to mount such a resistor on a limited space of a microwave IC having a high degree of integration.

Also, as another approach, it could be thought to mount a chip resistor on a substrate. According to this approach, however, a problem occurs in that, when the chip resistor is exchanged for another new chip resistor, wax material that remaining left on the surface of the substrate is oxidized, and thus adhesion of the new chip resistor to the substrate is lowered. This lowers reliability in operation of the device.

Also, even if an optimum resistance value can be set for the above balance resistor, it only has an effect on suppression of a loop oscillation, and has no effect on other oscillation modes, e.g., an oscillation due to an unstable domain.

SUMMARY OF THE INVENTION

An object of the present invention is to provide a power amplifier which can prevent the occurrence of a parasitic oscillation and thus contribute to an improvement in yield of a product.

According to the present invention, there is provided a power amplifier including: a power distributor for dividing an input signal into a plurality of equally power-distributed signals; a plurality of amplifying elements for amplifying the plurality of equally power-distributed signals divided by the power distributor, respectively; a power coupler for coupling respective output signals of the plurality of amplifying elements; and a variable resistance element connected between nodes having the same phase as each other on power transmission lines in at least one side of each input side and each output side of the plurality of amplifying elements.

BRIEF DESCRIPTION OF THE DRAWINGS

Other objects and features of the present invention will be described hereinafter in detail, by way of preferred embodiments and with reference to the accompanying drawings in which.

DESCRIPTION OF THE PREFERRED EMBODIMENTS

Figure 1:
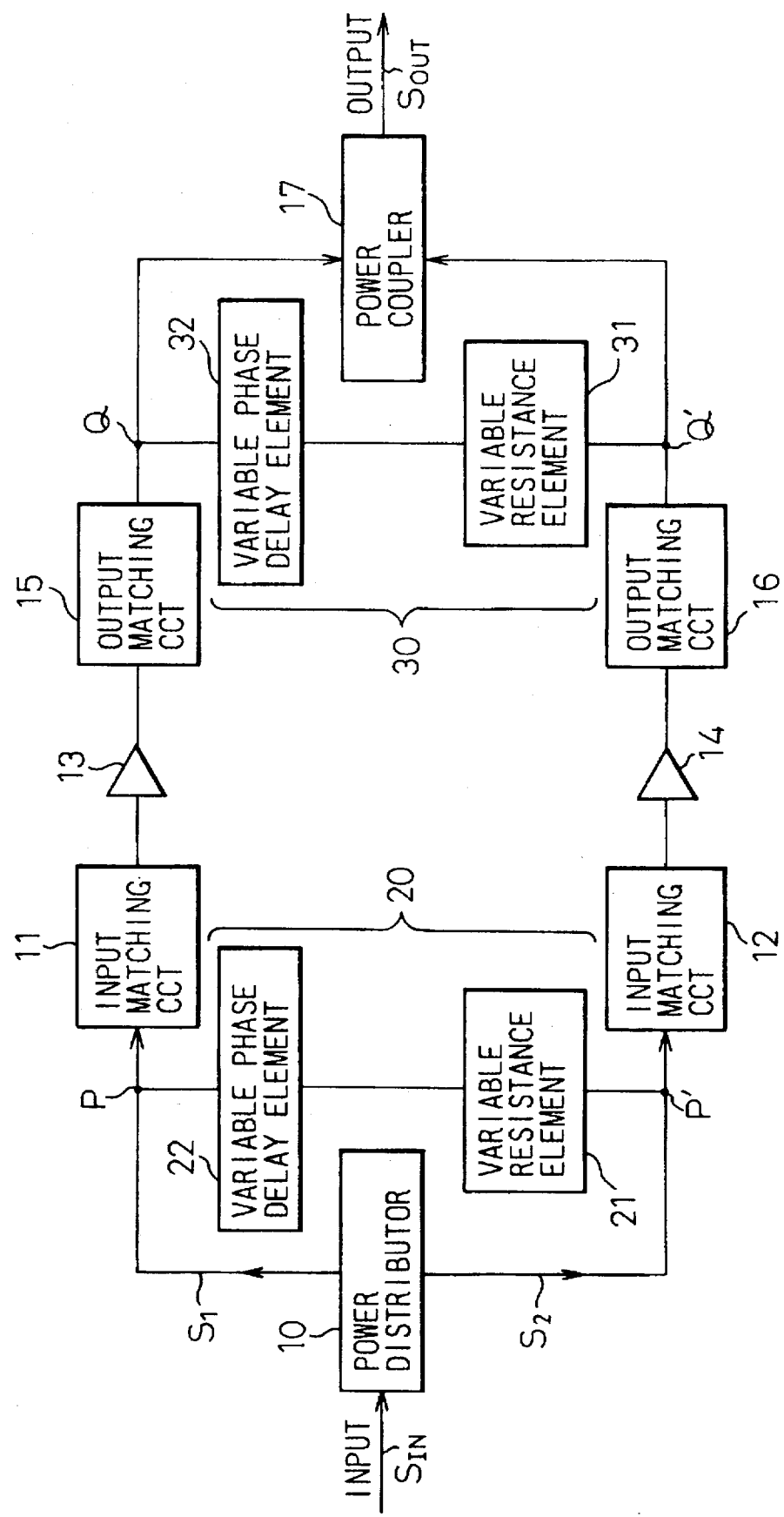
FIG. 1 is a block diagram showing the fundamental structure of a power amplifier according to the present invention.

FIG. 1 illustrates the fundamental structure of the power amplifier according to the present invention.

3

The illustrated power amplifier includes a power distributor 10 for dividing an input signal $S_{IN}$ into a plurality of equally power-distributed signals (for simplification of the illustration, only two signals $S_1$ and $S_2$ are shown); a plurality of amplifying elements (for simplification, only two amplifying elements 13 and 14 are shown) for amplifying the respective, equally power-distributed distributed signals $S_1$ and $S_2$ divided by the power distributor 10; a power coupler 17 for coupling together the respective output signals of the amplifying elements 13 and 14 and producing a combined, common output signal $S_{out}$; and variable resistance elements 21 and 31 provided between nodes P and P', and between nodes Q and Q', respectively, having the same phase as each other (i.e., a common phase) and disposed on power transmission lines respectively at the input side and the output side of the amplifying elements 13 and 14.

As described later, in a preferred embodiment of the present invention, variable phase delay elements 22 and 32 are provided in series with the variable resistance elements 21 and 31, respectively, between the nodes P, P', and Q and Q'. Also, the variable resistance element 21, 31 and the variable phase delay elements 22, 32, are implemented in combination, are in the form of function as trimming resistor 20, 30. Each of the trimming resistors 20, 30 is provided between corresponding the nodes P, P' and Q, Q' having the same phase as each other (i.e., a common place) on the power transmission lines and disposed in close vicinity of (i.e., close proximity of locations of the amplifying elements 13 and 14.

Also, in the preferred embodiment of the present invention, after the power amplifier is completed as a device, adjustment of resistance values of each variable resistance element 21, 31 is carried out by trimming bonding wires that are used in the trimming resistors 20 and 30. Furthermore, adjustment of the respective phase delay amounts of the variable phase delay elements 22, 32 is carried out by trimming the bonding wires so that the opposite ends of each resistance element, to be formed are located at unequal distances from respective, opposite end portions of the corresponding trimming resistors 20, 30.

According to the structure shown in FIG. 1, the variable resistance elements 21 and 31 and the variable phase delay elements 22 and 32 are provided at specific points (i.e., between the nodes P and P', and Q and Q') in the power amplifier and, after the completion of assembly work of each component, it is possible to adjust the above elements 21, 22, 31 and 32 individually or simultaneously in combination. In the preferred embodiment of the present invention, the adjustment can be carried out by trimming the bonding wires with respect to the trimming resistors 20 and 30.

Therefore, in the adjustment process which should be carried out after the power amplifier is completed as a device, it is possible to set a suitable balance resistance value and a suitable gain in the device. Thus, it is possible to effectively prevent occurrence of a parasitic oscillation, and to greatly contribute to an improvement in yield of the device, i.e., product.

Next, a preferred embodiment of the present invention will be explained with reference to FIGS. 2 to 6d.

Figure 2:
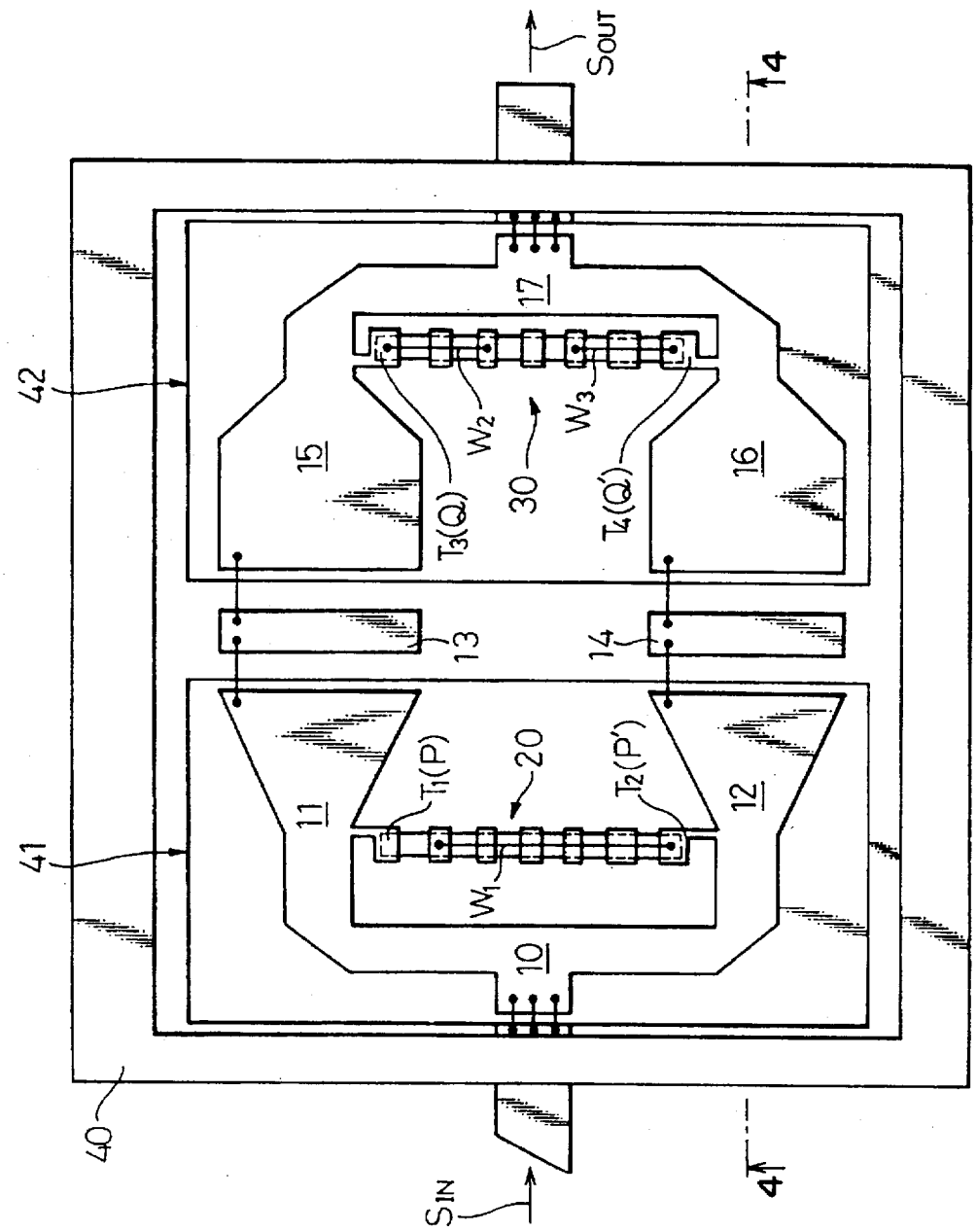
FIG. 2 is a plan view schematically showing a structure of a microwave balanced-type power amplifier according to an embodiment of the present invention.

FIG. 2 schematically shows, in plan view, a structure of the microwave balanced-type power amplifier according to an embodiment of the present invention. Note, constituent elements indicated by reference numerals 10 to 17, 20 and 30 correspond to those indicated by the same reference numerals shown in FIG. 1, and thus the explanation thereof is omitted.

4

In FIG. 2, reference 40 denotes a package for accommodating the present device, and references 41 and 42 denote matching circuit substrates, respectively. On the matching circuit substrate 41, there are formed the power distributor 10, the input matching circuits 11 and 12, and the trimming resistor 20. On the other hand, on the matching circuit substrate 42, there are formed the output matching circuits 15 and 16, the power coupler 17, and the trimming resistor 30. Each of the matching circuit substrates 41 and 42 mainly consists of alumina (dielectric constant : $\epsilon$ r=9.8) and barium (dielectric constant : $\epsilon$ r=40).

Also, references $T_1$ and $T_2$ respective end portions, functioning as resistance terminals of the trimming resistor 20 and references $T_3$ and $T_4$ denote, respectively, end portions, functioning as resistance terminals, of the trimming resistor 30. The resistance terminals $T_1$, $T_2$, $T_3$ and $T_4$ correspond to the nodes P, P', Q and Q' on the power transmission lines. Also, references $W_1$, $W_2$ and $W_3$ denote bonding wires, respectively, for use in adjustment of resistance values of the variable resistance elements 21 and 31, and for use in adjustment of phase delay amounts of the variable phase delay elements 22 and 32 (FIG. 1). Each bonding wire is composed of a wire or ribbon tape of gold (Au), and is suitably trimmed off, as occasion demands, after the power amplifier is completed as a product.

Figure 4:
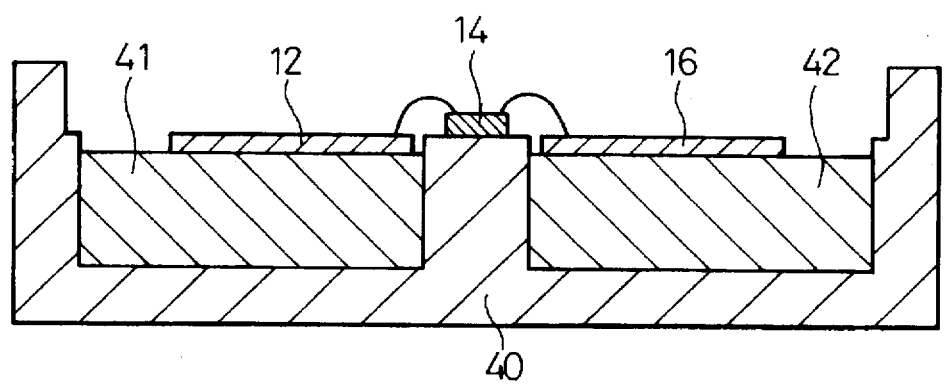
FIG. 4 is a sectional view taken along the line 4—4' in FIG. 2.

Also, each of the amplifying elements 13 and 14 is constituted by a field-effect transistor (FET) in the form of a chip, and is mounted on the package 40, separately from the matching circuit substrates 41 and 42 (see FIG. 4).

Figure 3A:
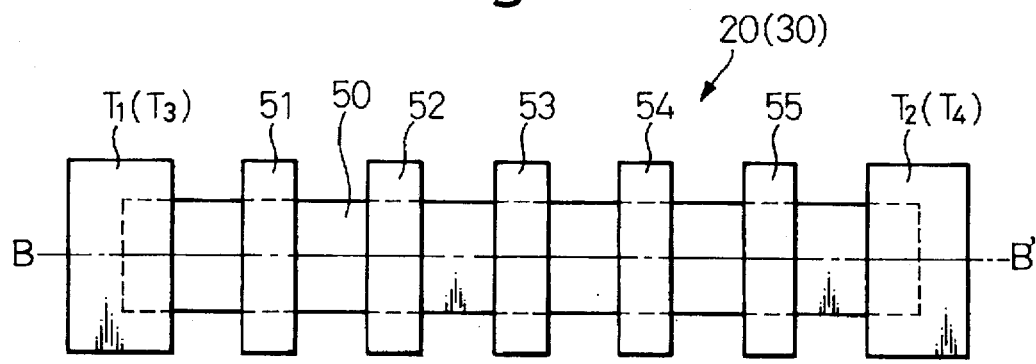
FIGS. 3a and 3b are a plan view and a sectional view, respectively, showing a structure of a trimming resistor shown in FIG. 2.
Figure 3B:
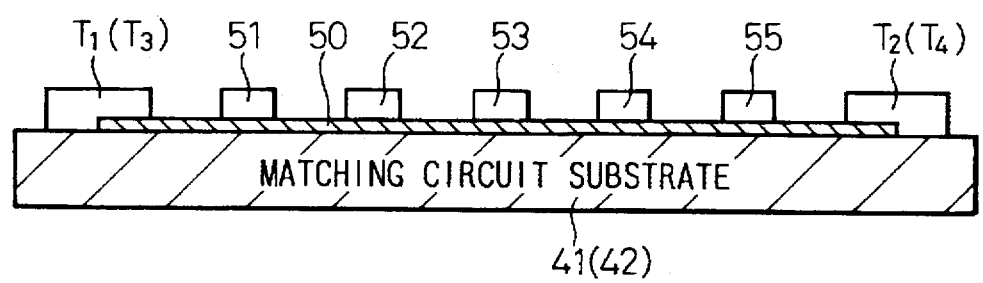

FIGS. 3a and 3b illustrate a structure of the trimming resistor 20 (30) characterizing the present invention.

As illustrated in FIG 3b, the trimming resistor 20 (30) is formed on the matching circuit substrate 41 (42) (omitted in FIG. 3b, and comprises by a sheet resistor 50 working as a resistance body; land portions 51 to 55 to which wires or ribbon tapes of gold (Au) (not shown) are suitably bonded for regulating the resistance value and/or phase delay; and resistance terminals $T_1$, and $T_2$, ($T_3$ and $T_4$). The sheet resistor 50 is composed of tantalic nitride (TaN), and the resistance terminals $T_1$ to $T_4$, are composed of gold (Au), respectively.

Also, the length between correpsonding end portions (i.e., resistance terminals $T_1$ and $T_2$, or $T_3$ , and $T_4$) of each trimming resistor 20 or 30 is suitably designed according to the size of the package 40 (see FIG. 2). For example, where the size of the package 40 is approximately 11 mm by 13 mm, the length between the opposite end portions of the trimming resistor 20 (30) is selected to be 2 mm to 4 mm. The length is sufficient to realize a phase conversion of microwaves (2 GHz to 8 GHz) treated by the present embodiment.

FIG. 4 illustrates a sectional structure taken along the line 4—4 ' in FIG. 2.

As illustrated, the input matching circuit 12 and the output matching circuit 16 are formed by metallization of gold (Au) with a thickness of 4 μm on the matching circuit substrates 41 and 42, respectively. Although not shown in FIG. 4, the formation also applies to the input matching circuit 11 and the output matching circuit 15. Also, the amplifying element 14 (13) is provided on the package 40 separately from the matching circuit substrates 41 and 42, and is bonded via respective wires of gold (Au) to the matching circuits 12 and 16 (11 and 15).

According to the above constitution, suitable wirings are made using wires or ribbon tapes of gold (Au) with respect to the trimming resistors 20 and 30 provided between the nodes P and P', and between the nodes Q and Q', respectively, having a common phase on respective input and output the power transmission lines. Accordingly, it is possible to easily carry out the wiring work using a wire bonder, and thus to assure a sufficient reliability after completion of the wiring work.

Also, according to the present embodiment, it is possible to obtain desirable resistance values between each of the two pairs of resistance terminals $T_1$ and $T_2$, and $T_3$ and $T_4$, (i.e., between the pair of nodes P and P', and between the pair of nodes Q and Q') of the trimming resistors 20 and 30, respectively. Furthermore, the bonding wires to be trimmed off, per se, function as the variable phase delay elements 22 and 32.

Figure 5A:
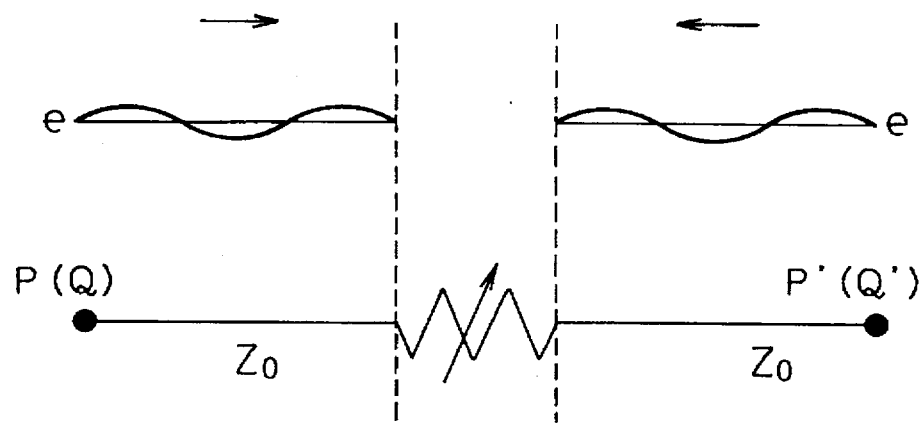
FIGS. 5a and 5b are diagrams for explaining the mode of operation and effect of the trimming resistor shown in FIG. 2.

Namely, even if the variable resistance element 21 or 31 presents ever the same resistance value, a great difference arises in the characteristics (especially in the gain) of the power amplifier, between the case (see FIG. 5a) that the resistance element to be formed is located in the center of the trimming resistor 20 or 30, and the case (see FIG. 5b) that the resistance element to be formed is located in the vicinity of (i.e., more clearly adjacent) one of the resistance terminal thereof.

Where the phase delay is not present, i.e., where the resistance element to be formed is located in the center of the trimming resistor as in FIG 5a, respective power waves "e" that are propagated from the pair of resistance terminals are in phase, and thus no power is dissipated in the resistance element. Therefore, in this case, the resistance element functions as a pure balance resistor. On the other hand, when the phase delay is present, i.e., where the resistance element to be formed is located in the vicinity of the resistance terminal P(Q) of the trimming resistor as in FIG 5b, respective power waves "e" that are propagated from the pair of resistance terminals P(Q) and P'(Q') are not in phase, and thus some power is dissipated in the resistance element. Therefore, in this case, the power dissipation suppresses the gain of the power amplifier to thereby bring the power amplifier into a stable state.

Figure 5B:
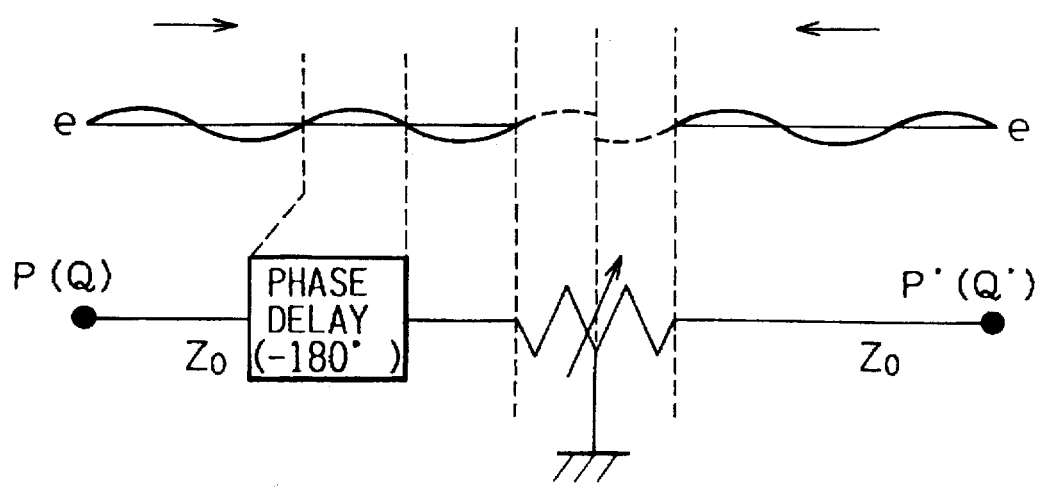

As seen from the locations of the resistance elements shown in FIGS. 5a and 5b and the connections of the bonding wires $W_1$ to $W_3$ shown in FIG. 2, in the input side of the amplifying elements 13 and 14 (i.e., on the matching circuit substrate 41), both the variable phase delay element 22 and the variable resistance element 21 are provided so as to cause a loss in the input power to thereby lower the gain of the power amplifier, as in FIG. 5b. Accordingly, it is possible to bring the input impedance seen from the amplifying elements 13 and 14 into a stable state. As a result, it is possible to prevent the occurrence of a parasitic oscillation due to an unstable domain.

On the other hand, in the output side of the amplifying elements 13 and 14 (i.e., on the matching circuit substrate 42), only the variable resistance element 31 is provided so as to form a pure balance resistor, as in FIG 5a. As a result, it is possible to effectively prevent occurrence of a loop oscillation.

FIGS. 6a to 6d show the effect of suppression of parasitic oscillations based on the embodiment of FIG. 2, compared with a prior art case.

Figure 6A:
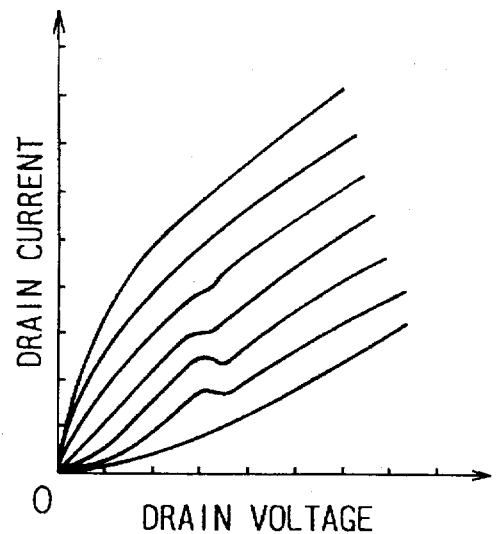
FIGS. 6a, 6b, 6c to 6d are graphs showing the effect of suppression of parasitic oscillations based on the embodiment of FIG. 2, compared with the case in a prior art.
Figure 6B:
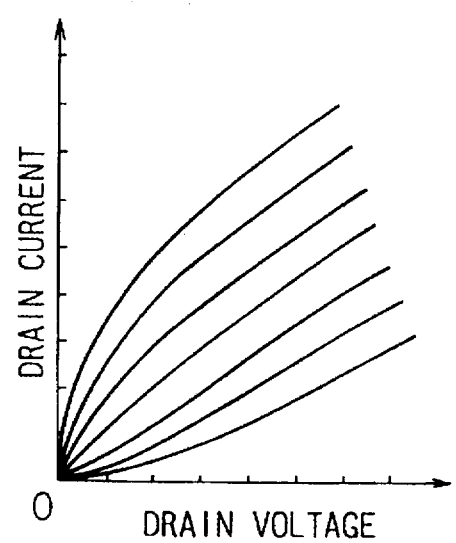
Figure 6C:
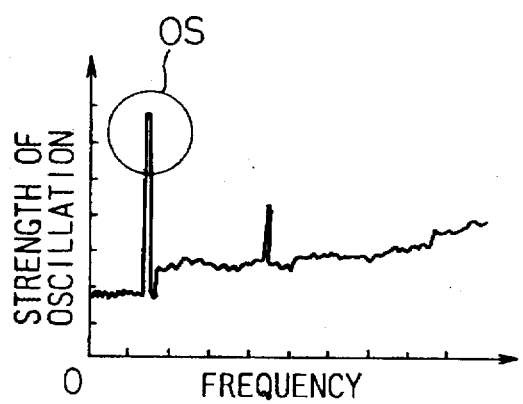

FIGS. 6a and 6b each show I-V curves representing the relationship between drain voltages and corresponding drain currents of an amplifying element (FET). Also, FIGS. 6c and 6d each show oscillation spectrum curves representing the relationship between the strength and corresponding frequency of oscillation. In FIGS. 6a and 6b, the axis of abscissa indicates 100 mA per one division, and the axis of ordinate indicates 500 mV per one division. Also, in FIGS. 6c and 6d, the axis of abscissa corresponds to the frequency range of 3.0 to 22.0 GHz, and the axis of ordinate indicates 10 dB per one division.

Figure 6D:
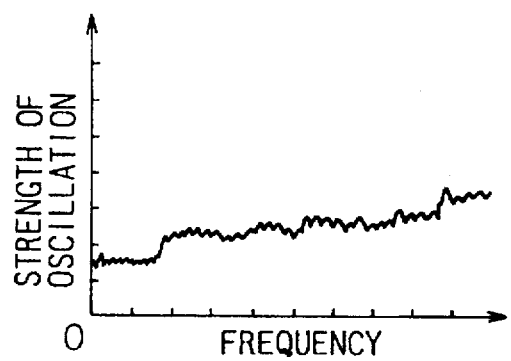

Although, in the prior art, the circuit operation becomes unstable due to excessive gains of FETs and thus a parasitic oscillation is caused (see the portions where bends of the curves are changed in FIG. 6a, and a parasitic oscillation pulse OS shown in FIG. 6c), the present embodiment can prevent any parasitic oscillation from being generated by suitably adjusting gains of the FETs in the adjustment process after the power amplifier is completed as a device (see FIGS. 6b and 6d).

Thus, according to the microwave balanced-type power amplifier of the present embodiment, it is possible to set a suitable balance resistance value and a suitable gain in the adjustment process which is carried out after the power amplifier is completed as a device. As a result, it is possible to effectively prevent occurrence of a parasitic oscillation which has been a problem in prior art microwave power amplifiers. This contributes to an improvement in yield of the device, i.e., product.

Although the present invention has been disclosed and described by way of one embodiment, it is apparent to those skilled in the art that other embodiments and modifications of the present invention are possible without departing from the essential features thereof.

What is claimed is:

1. A power amplifier comprising:
   a power distributor receiving and dividing an input signal into, and producing as outputs thereof, a plurality of equally power-distributed signals;
   a plurality of amplifying elements respectively corresponding to, and amplifying, said plurality of equally power-distributed signals output by said power distributor and producing a plurality of corresponding, amplified output signals;
   a power coupler coupling together the plurality of corresponding, amplified output signals of said plurality of amplifying elements; and
   a variable resistance element, comprising a trimming resistor, connected between a pair of corresponding nodes, having a common phase, of a pair of power transmission lines on one of an input side and an output side of said plurality of amplifying elements.

2. The power amplifier as set forth in claim 1, wherein said variable resistance element further comprises a variable phase delay element connected in series with said trimming resistor.

3. The power amplifier as set forth in claim 2, wherein said variable phase delay element comprises first and second conductors of respective, different lengths, connecting first and second opposite ends of the trimming resistor respectively to the pair of nodes having the common phase.

4. The power amplifier as set forth in claim 3, wherein said trimming resistor is provided between the pair of nodes, having a common phase, of said respective power transmission lines in close proximity to the corresponding locations of said plurality of amplifying elements.

5. The power amplifier as set forth in claim 3, wherein, after the power amplifier is completed as a device, a resistance value of said variable resistance element is adjusted by trimming bonding wires that are used in said trimming resistor.

6. The power amplifier as set forth in claim 3 wherein, after the power amplifier is completed as a device, a resistance value of said variable resistance element is adjusted by trimming bonding wires that are used in said trimming resistor, and a phase delay amount of said variable phase delay element is adjusted by trimming said bonding wires so that opposite ends of said variable resistance element, as thereby formed, are located at respective, unequal distances from respective, opposite end portions of said variable resistance element.

7. The power amplifier as set forth in claim 3, further comprising:

an input matching circuit, provided at an input side of a respective amplifying element, of said plurality of amplifying elements, for effecting impedance matching with respect to a corresponding power-distributed signal fed from said power distributor;

an output matching circuit, corresponding to the input matching circuit and provided at an output side of said respective amplifying element, for effecting impedance matching with respect to the corresponding, amplified output thereof and which is coupled by said power coupler;

a first matching circuit substrate on which said input matching circuit and said power distributor are mounted; and a second matching circuit substrate on which said output matching circuit and said power coupler are mounted.

8. The power amplifier as set forth in claim 7, further comprising first and second said trimming resistors formed respectively and connected between corresponding pairs of first nodes and second nodes, respectively on said first and second matching circuit substrates.

9. The power amplifier as set forth in claim 1, wherein said input signal is a high frequency band signal.

10. The power amplifier as set forth in claim 9, wherein said input signal is a microwave frequency band signal.

11. A power amplifier for receiving an input signal and producing an amplified signal at an output thereof, comprising:

a power distributor for receiving and dividing the input signal into, and producing a plurality of equally power-distributed signals as outputs thereof, the power distributor supplying the equally power-distributed output signals thereof to a first plurality of corresponding power transmission lines;

a plurality of amplifying elements having input sides respectively connected to the first plurality of power distribution lines for receiving therefrom, and amplifying, said plurality of corresponding, equally power-distributed signals and producing, and supplying to a second plurality of power transmission lines connected to output sides thereof, a plurality of corresponding, amplified output signals;

a power coupler connected to the second plurality of power transmission lines for receiving therefrom, and coupling together, the plurality of corresponding amplified output signals and producing the coupled together, amplified output signals as the amplified signal output of the power amplifier;

the first plurality of transmission lines having respective, first nodes of a first common phase and the second plurality of transmission lines having respective, second nodes of a second common phase; and a respective, variable resistance element associated with each pair of nodes, selectively, of one of the first plurality of nodes and of the second plurality of nodes, each variable resistance element comprising a trimming resistor connected between the respective, associated pair of nodes.

12. The power amplifier as set forth in claim 11, wherein each variable resistance element further comprises a variable phase delay element connected in series with the trimming resistor thereof between the respective, associated pair of nodes.

13. The power amplifier as set forth in claim 12, further comprising:

an input matching circuit, provided at an input side of a respective amplifying element, of said plurality of amplifying elements, for effecting impedance matching with respect to a corresponding power-distributed signal fed from said power distributor;

an output matching circuit, corresponding to the input matching circuit and provided at an output side of said respective amplifying element, for effecting impedance matching with respect to the corresponding, amplified output signal thereof and which is coupled by said power coupler;

a first matching circuit substrate on which said input matching circuit and said power distributor are mounted; and a second matching circuit substrate on which said output matching circuit and said power coupler are mounted.

14. The power amplifier as set forth in claim 1 wherein the variable resistance element provides a bidirectional conducting path between the pair of corresponding nodes.

15. The power amplifier as set forth in claim 11 wherein the variable resistance element provides a bidirectional conducting path between the pair of corresponding nodes.

16. A power amplifier comprising:

a power distributor receiving, and dividing, an input signal into a plurality of equally power-distributed signals produced as outputs thereof;

a plurality of amplifying elements;

a first plurality of power transmission lines corresponding to and respectively receiving, and supplying, the plurality of equally power-distributed signal outputs of the power distributor to the plurality of amplifying elements, the plurality of amplifying elements respectively amplifying the plurality of equally power-distributed signals supplied thereto and producing, respectively, a plurality of corresponding, amplified output signals;

a second plurality of power transmission lines respectively connected to the plurality of amplifying elements and receiving the plurality of corresponding amplified output signals thereof;

a power coupler coupled to the second plurality of power transmission lines and receiving therefrom the plurality of corresponding amplified output signals;

a plurality of nodes comprising at least a pair of first and second nodes respectively in corresponding first and second power transmission lines of a selected one of the first and second pluralities of power transmission lines; and a respective element connected to, and providing a bidirectional conducting path between, each pair of corresponding first and second nodes, each element comprising a selected one of a first circuit element, comprising a balancing resistor, and a second circuit element, comprising a series-connected combination of a balancing resistor and a phase delay element.

17. A power amplifier as set forth in claim 16, wherein said balancing resistor, of each of said first and second selectable circuit elements, comprises a selectively variable resistance element.

18. A power amplifier as set forth in claim 16, wherein said phase delay element comprises a selectably variable phase delay element.

19. A power amplifier as set forth in claim 16, wherein:
the element further comprises a pair of first and second opposite end terminals respectively connected to the pair of corresponding first and second nodes and first and second electrical conductors respectively connecting the first and second opposite end terminals of the element to the corresponding first and second nodes.

20. A power amplifier as set forth in claim 18, wherein the phase delay element is defined by respective, different lengths of the first and second conductors.

21. A power amplifier as set forth in claim 16, wherein each element further comprises a pair of first and second opposite end terminals, plural resistive element portions connected in series therebetween, a respective conductive land portion between each pair of adjacent resistive element portions and an electrical conductor selectively interconnecting said land portions, in succession, to each other and to the first and second opposite end terminals.

22. A power amplifier as set forth in claim 21, wherein the balancing resistor of the selected, first circuit element comprises a number of selected resistive element portions centrally and symmetrically disposed between the opposite end terminals thereof, each selected resistive element portion being defined by the absence of any electrical conductor interconnecting the respective land portions.

23. A power amplifier as set forth in claim 21, wherein the balancing resistor of the selected, second circuit element comprises a number of selected resistive element portions centrally and non-symmetrically disposed between the opposite end terminals thereof, each selected resistive element portion being defined by the absence of any electrical conductor interconnecting the respective land portions, and the phase delay element comprises first and second conductors, of respective and different lengths, connecting the land portions comprising opposite end terminals of the balancing resistor respectively to the corresponding first and second nodes.

* * * * *

UNITED STATES PATENT AND TRADEMARK OFFICE
CERTIFICATE OF CORRECTION

PATENT NO. : 5,684,430
DATED : Nov. 4, 1997
INVENTOR(S) : YAMAMOTO

It is certified that error appears in the above-identified patent and that said Letters Patent is hereby corrected as shown below:

Col. 1,  line 9, change ", and" to --and,--;
 line 44, after "met" insert --,--.

Col. 2,  line 6, change "set" to --setting--;
 line 14, delete "left";
 line 55, change " 4-4' " to -- 4-4 --.

Col. 3,  line 20, change "Q and" to --Q,--;
 line 21, change "element" to --elements--;
 line 23, change "resistor" to --resistors--;
 line 25, change "corresponding the" to --the corresponding--;
 line 28, change "proximity of" to --proximity to) the--.

Col. 4,  line 12, after "T$_2$" insert --denote--;
 line 13, after "terminals" insert --,--;
 line 17, change "lines." to --lines, respectively.--;
 line 19, delete "respectively,";
 line 34, delete "by";
 line 54, change " 4-4' " to -- 4-4 --.

Col. 5,  line 2, after "on" insert --the--;
 line 3, delete "the".

UNITED STATES PATENT AND TRADEMARK OFFICE
CERTIFICATE OF CORRECTION

PATENT NO. : 5,684,430
DATED : Nov. 4, 1997
INVENTOR(S) : YAMAMOTO

It is certified that error appears in the above-identified patent and that said Letters Patent is hereby corrected as shown below:

Col. 7, line 20 (claim 7, line 12), after "output" insert --signal--.

Signed and Sealed this

Third Day of March, 1998

*Attest:*

BRUCE LEHMAN

*Attesting Officer*  *Commissioner of Patents and Trademarks*